United States Patent
Nam et al.

(10) Patent No.: US 9,570,424 B2
(45) Date of Patent: Feb. 14, 2017

(54) LIGHT SOURCE MODULE AND MANUFACTURING METHOD THEREOF, AND BACKLIGHT UNIT

(71) Applicant: Seoul Semiconductor Co., Ltd., Ansan-si (KR)

(72) Inventors: Ki Bum Nam, Ansan-si (KR); Yu Dae Han, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 3 days.

(21) Appl. No.: 14/471,215

(22) Filed: Aug. 28, 2014

(65) Prior Publication Data

US 2015/0060905 A1    Mar. 5, 2015

(30) Foreign Application Priority Data

Aug. 28, 2013    (KR) .......... 10-2013-0102599

(51) Int. Cl.
*H01L 33/50*  (2010.01)
*H01L 33/60*  (2010.01)
*H01L 25/075*  (2006.01)
*H01L 33/62*  (2010.01)

(52) U.S. Cl.
CPC .......... *H01L 25/0753* (2013.01); *H01L 33/60* (2013.01); *H01L 33/505* (2013.01); *H01L 33/62* (2013.01); *H01L 2224/16225* (2013.01)

(58) Field of Classification Search
CPC .......... H01L 33/50–33/644; H01L 33/22; G02B 6/0073
USPC .......... 257/59, 72, 79, 88–91, 98–100, E33.001,257/E33.005–E33.006, E33.056–E33.059; 438/22, 26–30, 34–35
See application file for complete search history.

(56) References Cited

U.S. PATENT DOCUMENTS

| | | | | |
|---|---|---|---|---|
| 6,359,670 B1* | 3/2002 | Broer | .................. | G02B 5/3016 349/115 |
| 8,434,910 B2* | 5/2013 | Kim | .................. | H01L 33/58 257/98 |
| 2004/0124430 A1* | 7/2004 | Yano | .................. | H01L 33/44 257/98 |
| 2004/0188696 A1* | 9/2004 | Hsing Chen | .................. | H01L 24/97 257/99 |
| 2005/0200269 A1* | 9/2005 | Ng | .................. | H01L 33/507 313/502 |
| 2006/0163601 A1* | 7/2006 | Harle | .................. | H01L 33/486 257/100 |
| 2006/0180818 A1* | 8/2006 | Nagai et al. | .................. | 257/89 |
| 2006/0186425 A1* | 8/2006 | Yano | .................. | F21K 9/00 257/98 |
| 2006/0255716 A1* | 11/2006 | Tsutsumi | .................. | B82Y 30/00 313/502 |
| 2007/0102718 A1* | 5/2007 | Takekuma | .................. | G02B 6/003 257/98 |
| 2007/0252163 A1* | 11/2007 | Kuan | .................. | F21K 9/00 257/98 |
| 2007/0295973 A1* | 12/2007 | Jinbo et al. | .................. | 257/88 |
| 2008/0123337 A1* | 5/2008 | Higashi et al. | .................. | 362/267 |

(Continued)

*Primary Examiner* — William F Kraig
*Assistant Examiner* — Maliheh Malek
(74) *Attorney, Agent, or Firm* — H.C. Park & Associates, PLC

(57) ABSTRACT

A light source module includes a circuit board, light emitting diode chips mounted on the circuit board by flip-chip bonding or a surface mounting technology (SMT), and a diffusor covering the circuit board and the light emitting diode chips.

10 Claims, 5 Drawing Sheets

(56) References Cited

U.S. PATENT DOCUMENTS

| | | | |
|---|---|---|---|
| 2008/0179611 A1* | 7/2008 | Chitnis | H01L 33/508 257/98 |
| 2008/0211386 A1* | 9/2008 | Choi | H01L 33/504 313/503 |
| 2009/0146158 A1* | 6/2009 | Park | 257/89 |
| 2009/0303694 A1* | 12/2009 | Roth | C09K 11/7734 362/84 |
| 2010/0165600 A1* | 7/2010 | Ku | F21K 9/00 362/84 |
| 2010/0200882 A1* | 8/2010 | Kotani | C08G 59/3245 257/98 |
| 2010/0220463 A1* | 9/2010 | Kim et al. | 362/97.3 |
| 2010/0283079 A1* | 11/2010 | Choi et al. | 257/98 |
| 2010/0296270 A1* | 11/2010 | Gomi et al. | 362/97.3 |
| 2010/0320482 A1* | 12/2010 | Tachibana | H05K 3/284 257/88 |
| 2011/0006322 A1* | 1/2011 | Li et al. | 257/98 |
| 2011/0018026 A1* | 1/2011 | Konno | H01L 33/50 257/100 |
| 2011/0031516 A1* | 2/2011 | Basin | H01L 33/507 257/98 |
| 2011/0088770 A1* | 4/2011 | Allemand et al. | 136/256 |
| 2011/0096560 A1* | 4/2011 | Ryu et al. | 362/510 |
| 2011/0163338 A1* | 7/2011 | Won | 257/98 |
| 2011/0175124 A1* | 7/2011 | Bae et al. | 257/98 |
| 2011/0175860 A1* | 7/2011 | Kojima | 345/204 |
| 2011/0186814 A1* | 8/2011 | Kim | 257/13 |
| 2011/0199787 A1* | 8/2011 | Kim et al. | 362/612 |
| 2011/0215349 A1* | 9/2011 | An | H01L 33/08 257/89 |
| 2011/0222312 A1* | 9/2011 | Park | 362/613 |
| 2011/0284822 A1* | 11/2011 | Jung | H01L 33/505 257/13 |
| 2011/0291143 A1* | 12/2011 | Kim et al. | 257/98 |
| 2011/0297965 A1* | 12/2011 | Akimoto et al. | 257/79 |
| 2011/0297972 A1* | 12/2011 | Seo | H01L 25/0753 257/88 |
| 2011/0309388 A1* | 12/2011 | Ito et al. | 257/89 |
| 2012/0007130 A1* | 1/2012 | Hoelen | H01L 33/504 257/98 |
| 2012/0113328 A1* | 5/2012 | Takeshima et al. | 348/739 |
| 2012/0132890 A1* | 5/2012 | Song et al. | 257/13 |
| 2012/0248469 A1* | 10/2012 | Choi | 257/88 |
| 2012/0267654 A1* | 10/2012 | Lee et al. | 257/91 |
| 2012/0305962 A1* | 12/2012 | Won et al. | 257/98 |
| 2013/0010481 A1* | 1/2013 | Qin | 362/382 |
| 2013/0039013 A1* | 2/2013 | Waegli et al. | 361/720 |
| 2013/0049045 A1* | 2/2013 | Lee et al. | 257/98 |
| 2013/0049053 A1* | 2/2013 | Kususe et al. | 257/98 |
| 2013/0062632 A1* | 3/2013 | Lee | H01L 25/0753 257/88 |
| 2013/0077025 A1* | 3/2013 | Chen et al. | 349/64 |
| 2013/0119420 A1* | 5/2013 | Choi et al. | 257/98 |
| 2013/0214301 A1* | 8/2013 | Yamada | H01L 33/08 257/88 |
| 2013/0235577 A1* | 9/2013 | Park et al. | 362/235 |
| 2013/0264538 A1* | 10/2013 | Oh | 257/13 |
| 2013/0277689 A1* | 10/2013 | Lemay | G02B 5/282 257/88 |
| 2013/0328090 A1* | 12/2013 | Park et al. | 257/98 |
| 2014/0001501 A1* | 1/2014 | Park et al. | 257/91 |
| 2014/0001506 A1* | 1/2014 | Park et al. | 257/98 |
| 2014/0151734 A1* | 6/2014 | Ito et al. | 257/98 |
| 2014/0160754 A1* | 6/2014 | Lee et al. | 362/237 |
| 2014/0197438 A1* | 7/2014 | Oh | H01L 33/486 257/98 |
| 2014/0231850 A1* | 8/2014 | Tischler | H01L 33/508 257/98 |
| 2014/0239320 A1* | 8/2014 | Miyoshi et al. | 257/88 |
| 2014/0264412 A1* | 9/2014 | Yoon | H01L 33/504 257/98 |
| 2014/0319553 A1* | 10/2014 | Ye et al. | 257/89 |
| 2014/0339495 A1* | 11/2014 | Bibl | H01L 33/504 257/13 |
| 2014/0362603 A1* | 12/2014 | Song et al. | 362/612 |
| 2014/0367633 A1* | 12/2014 | Bibl | G02F 1/133603 257/13 |
| 2014/0367711 A1* | 12/2014 | Bibl et al. | 257/89 |
| 2015/0001463 A1* | 1/2015 | Choi et al. | 257/13 |
| 2015/0077966 A1* | 3/2015 | Bessho | G02B 5/0242 362/19 |
| 2015/0221843 A1* | 8/2015 | Choi | H01L 33/20 257/98 |
| 2015/0303352 A1* | 10/2015 | Jeong | H01L 33/385 257/98 |

* cited by examiner

LIGHT SOURCE MODULE AND MANUFACTURING METHOD THEREOF, AND BACKLIGHT UNIT

CROSS-REFERENCE TO RELATED APPLICATION

This application claims priority from and the benefit of Korean Patent Application No. 10-2013-0102599, filed on Aug. 28, 2013, which is hereby incorporated by reference for all purposes as if fully set forth herein.

BACKGROUND

Field

Aspects of the present invention relates to a light source module, and more particularly, to a light source module have a slim structure and excellent light efficiency and heat radiation characteristics, a manufacturing method thereof, and a backlight unit including the same.

Discussion of the Background

A general backlight unit has been widely used in a display device or a surface illuminator for providing light to a liquid crystal display.

A backlight unit included in a liquid crystal display is may be a direct-type backlight unit and an edge-type backlight unit, depending on a position of a light emitting device.

The direct-type backlight unit, which has started to be intensively developed for liquid crystal displays of 20 inches or more, includes a plurality of light sources disposed on a lower surface of a diffusing plate, to directly radiate light to a front surface of a liquid crystal display panel. Since the direct-type backlight unit has higher light use efficiency than that of the edge-type backlight unit, it is mainly used in large screen liquid crystal displays that need high luminance.

The edge-type backlight unit, which is used in a liquid crystal display having a relatively small size, such as a monitor of a laptop computer and a desktop computer, has advantages of good light uniformity, a long lifespan, and a slim profile.

Recently, in a middle or large sized display device, an interest in clear image quality and appearance quality depending on slimness has increased.

However, in the direct-type backlight unit included in the middle or large sized display device, which uses a scheme of directly radiating light from a portion under a display panel, an interval between a light source configured of a plurality of lamps or a plurality of light emitting diodes and the display panel should be sufficiently maintained, there was a limitation in slimming the direct-type backlight unit. In addition, in accordance with an increase in a size, a general direct-type backlight unit has gradually used a high output light source, which causes a problem in heat radiation.

The above information disclosed in this Background section is only for enhancement of understanding of the background of the invention and therefore it may contain information that does not form any part of the prior art nor what the prior art may suggest to a person of ordinary skill in the art.

SUMMARY OF THE INVENTION

Exemplary embodiments of the present invention provide a light source module having high output, high efficiency, and slimness, and having excellent heat radiation characteristics.

Exemplary embodiments of the present invention also provide a technology capable of providing a backlight unit with a slim profile.

Additional features of the invention will be set forth in the description which follows, and in part will be apparent from the description, or may be learned by practice of the invention.

According to an exemplary embodiment of the present invention, there is provided a light source module including: a circuit board; a plurality of light emitting diode chips mounted on the circuit board by flip-chip bonding or a surface mounting technology (SMT); and a diffusor covering the circuit board and the light emitting diode chips, such that it is advantageous in slimness and heat radiation.

According to an exemplary embodiment of the present invention, there is provided a light source module including: a diffusor; a plurality of light emitting diode chips mounted on a lower surface of the diffusor; a first resin covering the lower surface of the diffusor and the light emitting diode chips; bumps connected to electrodes of the light emitting diode chips and exposed from the first resin; a second resin covering the first resin; and conductive patterns formed on the bumps, wherein the second resin covers the conductive patterns.

According to an exemplary embodiment of the present invention, there is provided a backlight unit including: a light source module including a circuit board, a plurality of light emitting diode chips mounted on the circuit board by flip-chip bonding or an SMT, and a diffusor covering the circuit board and the light emitting diode chips; and optical sheets positioned on the light source module.

According to an exemplary embodiment of the present invention, there is provided a backlight unit including: a light source module including a diffusor, a plurality of light emitting diode chips mounted on a lower surface of the diffusor, a first resin covering the lower surface of the diffusor and the light emitting diode chips, bumps connected to electrodes of the light emitting diode chips and exposed from the first resin, a second resin covering the first resin; conductive patterns formed on the bumps; and optical sheets positioned on the light source module. The second resin covers the conductive patterns.

According to an exemplary embodiment of the present invention, there is provided a manufacturing method of a light source module, including: mounting a plurality of light emitting diode chips on a diffusor; forming bumps on the light emitting diode chips; forming a first resin covering the diffusor and the light emitting diode chips; exposing the bumps from the first resin; forming conductive patterns on the bumps; and forming a second resin covering the conductive patterns.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
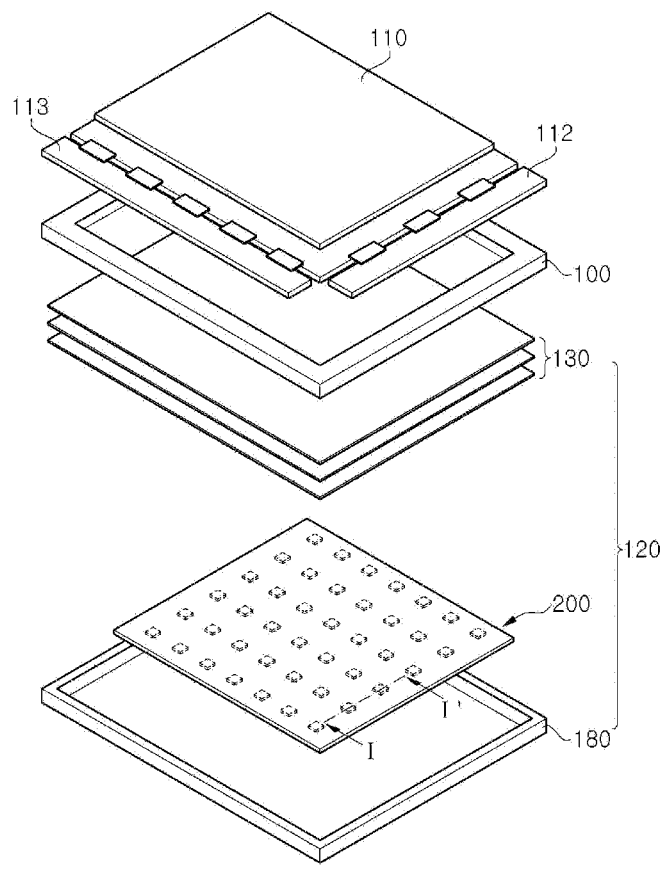
FIG. 1 is an exploded perspective view showing a display device including a light source module according to an exemplary embodiment of the present invention.

Hereinafter, exemplary embodiments of the present invention will be described in detail with reference to the accompanying drawings. Exemplary embodiments to be provided below are provided by way of example so that the idea of the present invention can be sufficiently transferred to those skilled in the art. Therefore, the present invention is not limited to exemplary embodiments to be described below, but may be implemented in other forms. In addition, in the accompanying drawings, shapes, and the like, of components may be exaggerated. Like reference numerals denote like components throughout the present specification. Modifications of components without departing from the scope of the present invention do not include restrictive meanings, but are descriptions for clearly representing a technical idea of the present invention and may be restricted by only contents mentioned in the claims.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Hereinafter, exemplary embodiments of the present invention will be described in detail with reference to the accompanying drawings so that those skilled in the art may easily practice the present invention.

Figure 2:
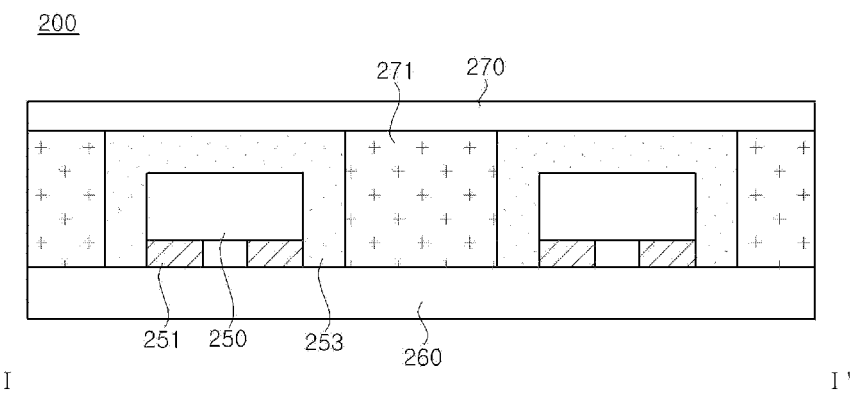
FIG. 2 is a cross-sectional view of the light source module taken along line I-I' of FIG. 1.

FIG. 1 is an exploded perspective view showing a display device including a light source module 200 according to an exemplary embodiment of the present invention; and FIG. 2 is a cross-sectional view of the light source module taken along line I-I' of FIG. 1.

As shown in FIGS. 1 and 2, the light source module 200 is included in a direct-type backlight unit 120 included in a medium or large sized display device. The display device includes a display panel 110, a panel guide 100, and the backlight unit 120.

Although not shown in FIGS. 1 and 2, the display device may further include a top cover (not shown) covering an upper edge of the display panel 110 and coupled to the backlight unit 120.

The display panel 110 includes a thin film transistor substrate and a color filter substrate bonded to each other, so as to face each other and allow a uniform cell gap to be maintained therebetween. A liquid crystal layer is interposed between the thin film transistor substrate and the color filter substrate.

Although not shown in detail in FIGS. 1 and 2, the thin film transistor substrate and the color filter substrate will be described in detail. In the thin film transistor substrate, a plurality of gate lines and data lines intersect with each other to define pixels, and thin film transistors (TFTs) are provided at each of intersection regions and are connected to pixel electrodes mounted in the respective pixels. The color filter substrate includes color filters corresponding to the respective pixels and having R, G, and B colors, and a black matrix surrounding each of the color filters and shielding the gate lines, data lines, thin film transistors, and the like.

An edge of the display panel 110 is provided with a gate driving printed circuit board (PCB) 112 supplying driving signals to the gate lines, and a data driving PCB 113 supplying driving signals to the data lines. The gate driving PCB 112 is not configured on a separate PCB, but may also be formed in a chip on glass (COB) on the thin film transistor substrate.

The gate and data driving PCBs 112 and 113 are electrically connected to the display panel 110 by a chip on film (COF). Here, the COF may be replaced by a tape carrier package.

The backlight unit 120 includes a lower cover 180, the light source module 200, and optical sheets 130. The lower cover 180 has a structure in which an upper surface thereof has an opening and serves to receive the light source module 200 and the optical sheets 130 therein.

The optical sheets 130 include a diffusing sheet, a light collecting sheet, and a protecting sheet. Here, the optical sheets 130 may be configured of one diffusing sheet and two light collecting sheets or may be configured of two diffusing sheets and one light collecting sheet, for example.

The light source module 200 is configured to include light emitting diode chips 250, wavelength converting layers 253, a circuit board 260, reflectors 271, and a diffusor 270. The light source module 200 has a structure in which the light emitting diode chips 250, the circuit board 260, the reflectors 271, and the diffusor 270 are modularized.

The light emitting diode chip 250 has a structure in which a semiconductor stacking part is formed on a substrate, although this is not shown in detail. The light emitting diode chip 250, which is a flip chip, has electrode pads (not shown) formed there below. The light emitting diode chip 250 is mounted on the circuit board 260. The light emitting diode chip 250 is flip-chip-bonded without using a bonding wire, such that it is electrically connected directly to board pads (not shown) on the circuit board 260. Here, the electrode pads exposed on a lower surface of the light emitting diode chip 250 and the board pads may have bumps 251 positioned therebetween, respectively. Since the light source module 200 does not include a bonding wire, it does not require a molding part for protecting the bonding wire. Therefore, a flip-chip-type light emitting diode chip 250 is adopted, thereby making it possible to remove a color deviation or a luminance blurring phenomenon and simplify a module manufacturing process, as compared with the case of adopting a light emitting diode chip using the bonding wire. Here, the light emitting diode chip 250 is not limited to being flip-chip-bonded, but may be mounted on the circuit board 260 by a surface mounting technology (SMT). The SMT may attach the light emitting diode chip 250 to the circuit board 260 using solder. Here, as the solder, a metal paste or an alloy such as AuSn, NiSn, or the like, may be used.

The wavelength converting layer 253 covers an upper surface and side surfaces of the light emitting diode chip 250. The wavelength converting layer 253 includes a phosphor and has a uniform thickness.

The circuit board 260 may be a thin-type board, for example, a flexible printed circuit board (FPCB).

The reflector 271 may be positioned between the light emitting diode chips 250. The reflector 271 serves to reflect light emitted from the side of the light emitting diode chip 250 toward the diffusor 270. That is, the reflector 271 reflects the light toward an upward direction of the light source module 200. The reflector 271 may further include an adhesive material.

The diffusor 270 covers the reflector 271 and the light emitting diode chip 250. In more detail, the diffusor 270 may contact an upper surface of the reflector 271 and an upper surface of the wavelength converting layer 253. The diffusor 270 serves to diffuse light from the light emitting diode chip 250, to convert the light into uniform surface light. The diffusor 270 may be made of polymethylmethacrylate (PMMA).

The light source module 200 may be advantageous in slimness and may minimize light loss, since the light emitting diode chip 250 is mounted on the circuit board 260 by the flip-chip-bonding or the SMT. That is, according to aspects of the present invention, the light source module 200 having high output and high efficiency may be implemented, and the direct-type backlight unit 120 having high efficiency and a slim profile may be implemented since, the light emitting diode chips 250, the circuit board 260, the reflectors 271, and the diffusor 270 are modularized.

In addition, a light source module according to the present disclosure has excellent heat radiation characteristics, since the light emitting diode chip 250 is mounted on the circuit board 260 by the flip-chip-bonding or the SMT.

Figure 3:
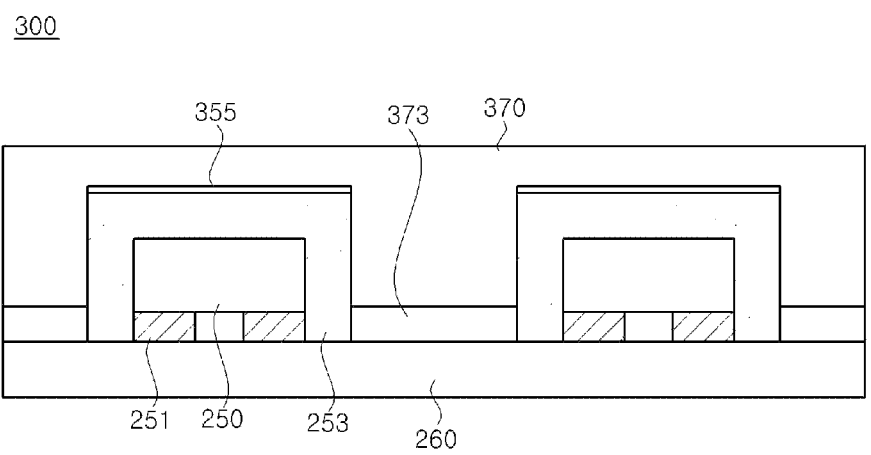
FIG. 3 is a cross-sectional view showing a light source module according to an exemplary embodiment of the present invention.

FIG. 3 is a cross-sectional view showing a light source module 300 according to an exemplary embodiment of the present invention. As shown in FIG. 3, all components of a light source module 300, except for an adhesive member 373, a diffusor 370, and a transflective layer 355, are the same as those of the light source module 200 (see FIG. 2). Therefore, a detailed description of similar elements will be omitted.

The adhesive member 373 is positioned between the light emitting diode chips 250 and is attached onto the circuit board 260. The adhesive member 373 is a film-type adhesive member and includes a reflecting material. For example, the adhesive member 373 may be configured of a plurality of layers including a reflecting layer and an adhesive layer.

The diffusor 370 covers the adhesive member 373 and the light emitting diode chip 250. In more detail, the diffusor 370 is positioned on the adhesive member 373, the transflective layer 355, and the wavelength converting layer 253. Here, the diffusor 370 may be aligned on the circuit board 260 by the adhesive member 373.

The transflective layer 355 is positioned on an upper surface of the wavelength converting layer 253. The transflective layer 355 transmits a portion of the light emitted from the wavelength converting layer 253 and reflects a remainder the light. That is, the transflective layer 355 disperses the light concentrated toward the upward direction of the wavelength converting layer 253. The transflective layer 355 may be formed of a thin film metal layer, a resin mixed with a reflecting material, or the like.

As described above, the light source module 300 may have a slim profile and may minimize light loss, since the light emitting diode chip 250 is mounted on the circuit board 260 by the flip-chip-bonding or the SMT. That is, according to the present invention, the light source module 300 having a high output and efficiency may be implemented, and the direct-type backlight unit having high efficiency and advantageous in slimness may be implemented, since the light emitting diode chips 250, the circuit board 260, and the diffusor 370 are modularized.

In addition, the light source module 300 may provide uniform light, since the transflective layer 355 is positioned on the upper surface of the wavelength converting layer 253.

Figure 4:
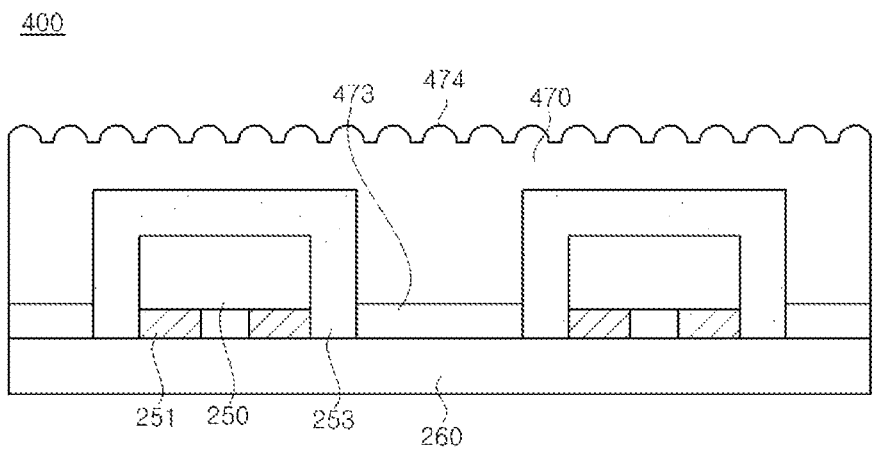
FIG. 4 is a cross-sectional view showing a light source module according to an exemplary embodiment of the present invention.
Figure 5:
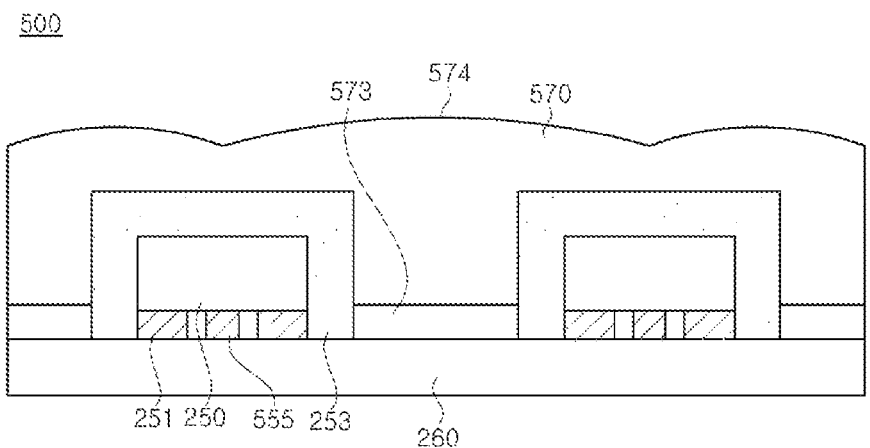
FIG. 5 is a cross-sectional view showing a light source module according to an exemplary embodiment of the present invention.

FIG. 4 is a cross-sectional view showing a light source module 400 according to an exemplary embodiment of the present invention; and FIG. 5 is a cross-sectional view showing a light source module 500 according to an exemplary embodiment of the present invention.

All components of light source modules 400 and 500 shown in FIGS. 4 and 5, except for protrusions 474 and 574 and a heat radiating bump 555, are the same as those of the light source module 300 (see FIG. 3). Therefore, a detailed description of similar elements will be omitted.

Referring to FIG. 4, the light source module 400 the protrusions 474 formed on an upper surface of a diffusor 470. The protrusions 474 have a semi-cylindrical or hemispherical convex shape and are spaced apart from one another on the upper surface of the diffusor 470 by a predetermined interval. However, the protrusions 474 are not limited thereto, but may also be formed as micro-lenses having a protruding shape. The protrusions 474 serve to improve extraction of the light in the upward direction from the light source module 400.

Referring to FIG. 5, the light source module 500 includes the protrusions 574, which form a concavo-convex pattern on the surface of the diffusor 570. The protrusions 574 serve to improve extraction of the light toward the upward direction of the light source module 500.

The light source module 500 further includes the heat radiating bump 555, so that heat generated by the light emitting diode chip 250 is easily transferred to the circuit board 260. The heat radiating bump 555 may be insulated from a wiring through which a driving signal of the light emitting diode chip 250 is supplied. A position of the heat radiating bump 555 is not particularly limited. For example, the heat radiating bump 555 may be positioned between the bumps 251.

As described above, the light source modules 400 and 500 may have a slim profile and may minimize light loss, since the light emitting diode chip 250 is mounted on the circuit board 260 by the flip-chip-bonding or the SMT. That is, the light source modules 400 or 500 having high output and high efficiency may be implemented, and the direct-type backlight unit having high efficiency and a slim profile may be implemented since the light emitting diode chips 250, the circuit board 260, and the diffusor 470 or 570 are modularized.

In addition, the light source modules 400 and 500 include the protrusions 474 and 574 formed on upper surfaces of the diffusors 470 and 570, respectively, such that the extraction of the light is improved, thereby making it possible to improve light efficiency.

In addition, the light source module 500 includes the heat radiating bump 555 for radiating heat, thereby making it possible to improve heat radiation characteristics.

Figure 6:
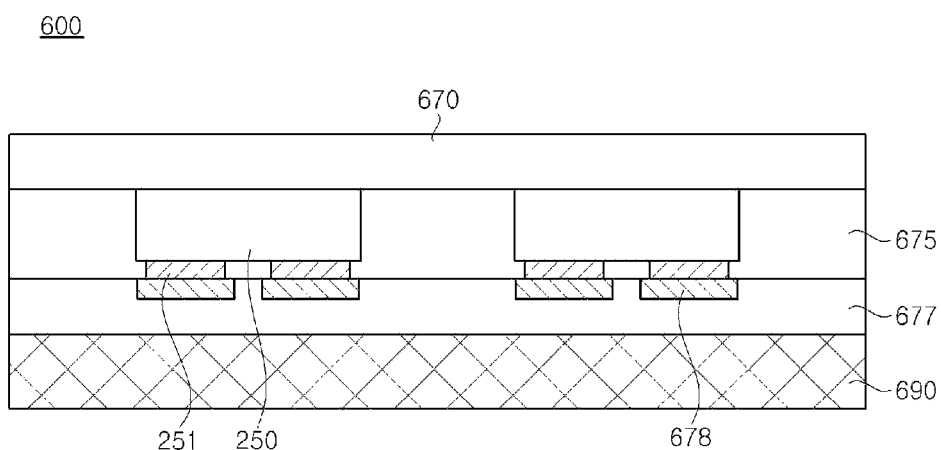
FIG. 6 is a cross-sectional view showing a light source module according to an exemplary embodiment of the present invention.

FIG. 6 is a cross-sectional view showing a light source module 600 according to an exemplary embodiment of the present invention. As shown in FIG. 6, the light source module 600 includes a diffusor 670, the light emitting diode chip 250, a first resin 675, and a second resin 677.

The diffusor 670 serves to diffuse light. Although not shown in FIG. 6, the diffusor 670 may have a wavelength converting layer (not shown) positioned on a surface thereof. The wavelength converting layer may be an application-type or a film-type.

The light emitting diode chip 250 is mounted beneath the diffusor 670. That is, an upper surface of the light emitting diode chip 250 directly contacts a lower surface of the diffusor 670.

The first resin 675 covers the light emitting diode chip 250. In more detail, the first resin 675 covers the diffusor 670 and the light emitting diode chip 250, and exposes the bumps 251 positioned on the light emitting diode chip 250. The first resin 675 may include a reflecting material. The first resin 675 may include, for example, $SiO_2$ or $TiO_2$, but is not particularly limited thereto.

The second resin 677 includes conductive patterns 678. The conductive patterns 678 operate as a wiring electrically connected to the light emitting diode chip 250 to supply a driving signal. The conductive patterns 678 are exposed from the second resin 677 and are electrically connected to the bumps 251. The conductive patterns 678 may be made of a transparent metal. For example, the conductive patterns 678 may be made of ITO, ZnO, or the like. The second resin 677 may include a reflecting material. The second resin 677 may include, for example, $SiO_2$ or $TiO_2$, but is not particularly limited thereto.

The light source module 600 may further include a heat sink 690 disposed beneath the second resin 677, in order to radiate heat.

Although not shown in FIG. 6, the light source module 600 may further include a reflecting layer (not shown). The reflecting layer may be disposed at any position in a region below the light emitting diode chip 250, in a state in which it is insulated from the conductive patterns 678.

As described above, the light source module 600 may have a slim profile, high output, high efficiency, and excellent heat radiation characteristics, since the circuit board is omitted.

FIGS. 7 to 10 are views showing a manufacturing method of the light source module 600, according to an exemplary embodiment of the present invention.

Figure 7:
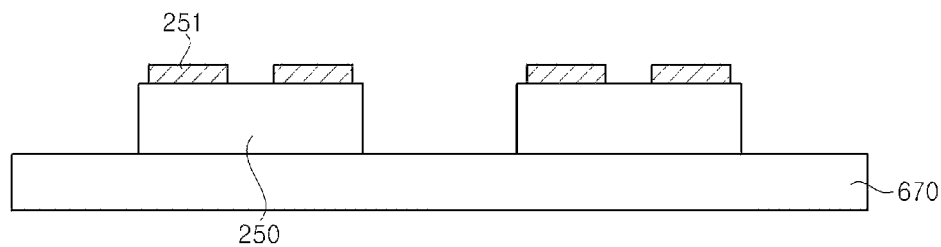
FIGS. 7 to 10 are views showing a manufacturing method of the light source module of FIG. 6, according to an exemplary embodiment of the present invention.

Referring FIG. 7, in a first step of the manufacturing method, the light emitting diode chip 250 is mounted on one surface of the diffusor 670, and the bumps 251 are formed so as to be electrically connected to the electrode pads (not shown) exposed on the light emitting diode chip 250.

Figure 8:
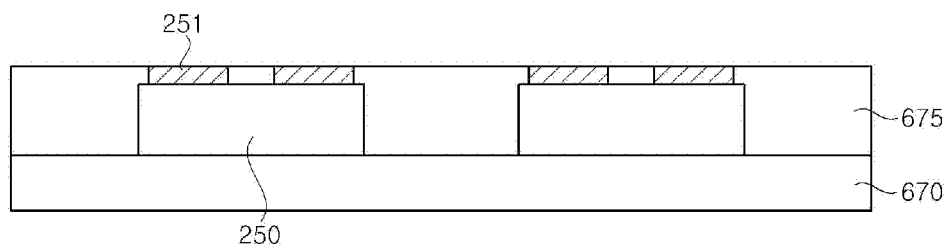

Referring to FIG. 8, in a second step, the first resin 675 covering the diffusor 670, the light emitting diode chip 250, and the bumps 251 is formed. Then, in the second step, the bumps 251 are exposed from the first resin 675 by a polishing process or an etching process.

Figure 9:
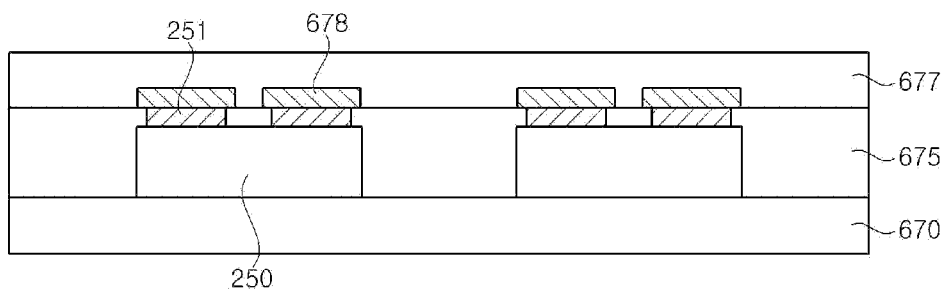

Referring to FIG. 9, in a third step, the conductive patterns 678 electrically connected to the bumps 251 are formed by a printing process. Then, in the third step, the second resin 677 covering the first resin 675 as well as the conductive patterns 678 is formed.

Figure 10:
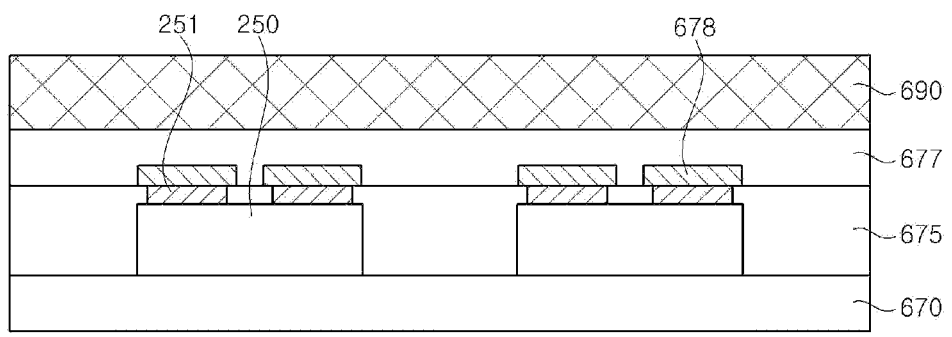

Referring to FIG. 10, in a fourth step, the heat sink 690 for radiating heat is attached onto the second resin 677.

As described above, the light source module 600 may be advantageous in slimness and may have excellent heat radiation characteristics, since a general circuit board is omitted by printing the conductive patterns 678 on the bumps 251 and covering the conductive patterns 678 with the second resin 677.

Figure 11:
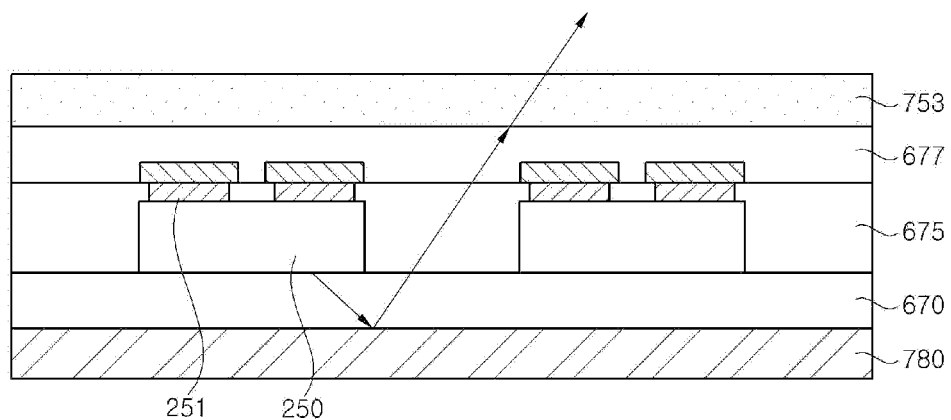
FIG. 11 is a cross-sectional view showing a light source module according to an exemplary embodiment of the present invention.

FIG. 11 is a cross-sectional view showing a light source module according to an exemplary embodiment of the present invention. As shown in FIG. 11, all components of a light source module 700, except for a wavelength converting layer 753 and a reflecting layer 780, are the same as those of the light source module 600 (see FIG. 6). Therefore, a detailed description of similar elements will be omitted.

The light source module 700 includes the light emitting diode chip 250 mounted on one surface of the diffusor 670 and the reflecting layer 780 positioned on the other surface of the diffusor 670. The light emitted from the light emitting diode chip 250 is discharged to the outside through the diffusor 670, the reflecting layer 780, and first and second resins 675 and 677.

The wavelength converting layer 753 is positioned on the second resin 677 and converts a wavelength of the light provided from the second resin 677.

As described above, the light source module 700 may be advantageous in slimness and may have excellent heat radiation characteristics, since a general circuit board is omitted by printing the conductive patterns 678 on the bumps 251 and covering the conductive patterns 678 with the second resin 677.

In addition, the light source module 700 has uniform luminance, since the light is reflected by the reflecting layer 780 and is discharged via the diffusor 670 and the first and second resins 675 and 677.

According to exemplary embodiments of the present invention, the light source module may have a slim profile, may minimize the light loss, and may be implemented so as to have a high output and a high efficiency, since a light emitting diode chip is mounted on the circuit board by the flip-chip-bonding or the SMT. In addition, the direct-type backlight unit having the high efficiency and slim profile may be implemented since the light emitting diode chips, the circuit board, and the diffusor are modularized.

Further, the light source module has the excellent heat radiation characteristics, since the light emitting diode chip is mounted on the circuit board by the flip-chip-bonding or the SMT.

Furthermore, the light source module is advantageous in having a slim profile and has the excellent heat radiation characteristics, since the circuit board is omitted by mounting the light emitting diode chips on the diffusor, forming the conductive patterns on the bumps, and using the resin.

Although various exemplary embodiments have been described hereinabove, the present invention is not limited to specific exemplary embodiments. In addition, components described in specific exemplary embodiments may be similarly applied to other exemplary embodiments without departing from the spirit of the present invention.

What is claimed is:

1. A light source module, comprising:
   a circuit board;
   light emitting diode chips mounted on the circuit board by flip-chip bonding or a surface mounting technology (SMT);
   a diffusor sheet covering the circuit board and the light emitting diode chips;
   a wavelength converting layer covering a top and sides of the light emitting diode chips, wherein a thickness of the wavelength converting layer on the top and the sides of the light emitting diode chips are the same; and
   a reflector disposed between the light emitting diode chips,
   wherein the diffusor is disposed directly on an upper surface of the reflector and an upper surface of the wavelength converting layer,
   a side surface of each wavelength converting layer is connected to a corresponding reflector; and
   an upper surface of the diffusor sheet is flat.

2. A light source module, comprising:
   a circuit board;
   light emitting diode chips mounted on the circuit board by flip-chip bonding or a surface mounting technology (SMT);
   a diffusor covering the circuit board and the light emitting diode chips;
   a wavelength converting layer covering a top and sides of the light emitting diode chips, wherein thicknesses of the wavelength converting layer on the top and the sides of the light emitting diode chips are the same; and
   a transflective layer disposed on the wavelength converting layer, the transflective layer configured to transmit a portion of received light and reflect a remaining portion of the received light, and being formed of a thin film metal layer or a resin mixed with a reflecting material.

3. The light source module of claim 2, further comprising an adhesive member disposed between the light emitting diode chips and contacting the circuit board.

4. The light source module of claim 3, wherein the adhesive member comprises a reflecting material and is a film-type adhesive member.

5. The light source module of claim 3, wherein the adhesive member comprises a reflecting layer and an adhesive layer.

6. The light source module of claim 2, further comprising protrusions disposed on an upper surface of the diffusor.

7. The light source module of claim 6, wherein the protrusions each have a semi-cylindrical or hemispherical shape and are spaced apart from one another on the upper surface of the diffusor.

8. The light source module of claim 6, wherein the protrusions form a concavo-convex structure.

9. The light source module of claim 1, further comprising bumps disposed between the light emitting diode chips and the circuit board, the bumps electrically connecting electrode pads of the light emitting diode chips and board pads of the circuit board.

10. The light source module of claim 9, further comprising a heat radiating bump disposed between the bumps.

* * * * *